United States Patent [19]

McCorkle

[11] 4,201,921
[45] May 6, 1980

[54] ELECTRON BEAM-CAPILLARY PLASMA FLASH X-RAY DEVICE

[75] Inventor: Richard A. McCorkle, South Salem, N.Y.

[73] Assignee: International Business Machines Corporation, Armonk, N.Y.

[21] Appl. No.: 927,238

[22] Filed: Jul. 24, 1978

[51] Int. Cl.² ............................................. H05B 31/22
[52] U.S. Cl. ................................. 250/493; 313/231.6; 315/111.2
[58] Field of Search ............... 250/493, 492 A, 492 B; 313/231.6, 231.7; 315/111.4, 111.7, 111.2

[56] References Cited

U.S. PATENT DOCUMENTS

| | | | |
|---|---|---|---|
| 2,972,698 | 2/1961 | Dana et al. | 313/231.7 |
| 3,022,444 | 2/1962 | Fischer | 313/231.7 |
| 3,280,360 | 10/1966 | Frost et al. | |
| 3,512,030 | 5/1970 | Levy | |
| 3,534,214 | 10/1970 | Völker | |
| 3,588,590 | 6/1971 | Zarowrir | |
| 3,596,128 | 7/1971 | Elliott | 313/231.6 |
| 3,777,208 | 12/1973 | Ryason | |
| 4,027,185 | 5/1977 | Nodwell et al. | |
| 4,042,848 | 8/1977 | Lee | |
| 4,053,802 | 10/1977 | Hartl | |

OTHER PUBLICATIONS

McCorkle et al, "Physical Properties of an Electron Beam-Sliding Spark Device", Rev. Sci. Instr. vol. 48, No. 8, 8/77, pp. 1055-1063.
Yoshimatsu et al, "High Brillance X-Ray Sources", X—Ray Optics, Application to Solids, vol. 2, Springer-Verlag, 1977.
"A Private Electron Storage Ring: Big Science Goes Commercial", Science, vol. 199, 1/78, pp. 411-413.
Mallozzi et al, "Diagnostic Techniques in Laser Fusion Research" Research Development, 2/76, pp. 30-42.
Conrads et al, "Continuum Radiation Source of High Intensity", J.O.S.A., vol. 58, No. 2, 2/68, pp. 202-206.
Fisher et al, "Fast Valve for Gas Injection into Vacuum", Rev. Sci. Instr., vol. 49, No. 6, 6/78, pp. 872-873.
Hawley, "Solid Insulators in Vacuum: A Review", Vacuum, vol. 18, No. 7, Pergauron Press, pp. 383-390.

Primary Examiner—Alfred E. Smith
Assistant Examiner—T. N. Grigsby
Attorney, Agent, or Firm—Michael J. Weins

[57] ABSTRACT

A method and device for the generation of x-rays is described. X-rays can be generated by establishing a high density plasma in a capillary passage and then passing an electron beam therethrough. The device has a cylindrical passage, the ends of which are maintained at a potential difference. An electrode is maintained at the potential and is slightly displaced from the higher potential end. When ions are supplied to the passage, the higher potential end is discharged and a high density plasma is created in the cylindrical passage. The discharge of the higher potential end of the cylindrical passage causes a discharge of the electrode into the passage forming an electron beam which interacts with the plasma, generating x-rays.

14 Claims, 2 Drawing Figures

ELECTRON BEAM-CAPILLARY PLASMA FLASH X-RAY DEVICE

DESCRIPTION

1. Technical Field

A device for generating flash high intensity soft x-rays is described. More particularly the device is designed to generate a tightly focused electron beam and a high density, high temperature plasma. The interaction of the plasma and the electron beam creates soft x-rays.

2. Background Art

High intensity x-rays have been generated by the flash x-ray techniques, and generally speaking these have been used for the purpose of quality control. Radiographs of thick sections can be produced in reasonably short times by employing flash x-rays with approximately 500 kv excitation. Flash x-ray techniques have also been used for radiating materials to induce physical changes in the material properties. The spectrum of radiation generated by the current flash x-ray machines in general has wavelengths less than 2 Å.

In general the same type of machines may be used for medical examination, however, for medical examination, the voltage is usually reduced to 150 kv. Using x-rays generated at this manner, one can readily observe fractures in bones. Again the maximum wavelength for x-rays so generated is in the neighborhood of 2 Å. U.S. Pat. No. 4,053,802 is illustrative of one of the current x-ray tubes that is usable for the above described uses. While generation of flash x-rays in the hard x-ray segment of the spectrum has allowed one to observe relatively thick sections of both organic and inorganic materials, these x-rays are not particularly effective when used to study thinner sections of material. If, for example, one were to use hard x-rays (e.g., wavelength of less than about 20 Å) to study a thin section of biological material such as a cell, the radiograph would have essentially no contrast since these hard x-rays would penetrate through all sections of the sample with equal intensity. It is therefore necessary to develop softener x-rays that have longer wavelengths and are less energetic, for biological microscopy. The soft x-ray spectrum strongly exposes x-ray photoresists making this soft portion of the spectrum desirable for x-ray lithography.

It is appreciated that there is a need for the production of a broader spectrum of x-ray radiation, and in particular for softer x-rays. In order to produce a broader spectrum, the usual approach has been to drop the voltage and lower the Z number of the material used as a target. These changes generally result in a lack of x-ray intensity. The intensity of the x-rays generated can be increased by increasing the current while either water cooling the tube or using a rotating anode. A further discussion of these techniques is contained in X-Ray Optics, Applications to Solids, Vol. 2, High Brilliance X-Ray Source, by M. Yoshimatsu and S. Kozaki, Springer-Verlag Berlin, Heidelberg, New York, 1977. While these techniques have broadened the spectrum of x-ray emissions they have been found to be generally ineffective for use in x-ray lithography and x-ray microscopy due to the fact that the required exposure times are extremely long.

The exposure time may be reduced by employing a synchrotron. While the synchrotron will substantially reduce the time of exposure such an installation is costly, and requires appreciable operational overhead and maintenance. A further discussion of synchrotron is contained in Science, Vol. 199, January 1978, pp. 411–413. Furthermore, the use of the synchrotron will still require several minutes of exposure time. When one is working with living organisms these times may be unduly long and allow the structure to change during the exposure. In lithography, a similar problem exists in that there may be a shift between a mask and an underlying substrate during the exposure.

In order to further reduce the exposure times plasma techniques have been used to generate soft x-rays. With the advent of high powered lasers generated by Q-switching, it is possible to focus intense radiation onto a material and thereby generate soft x-rays. This system is both costly and difficult to construct, and furthermore, suffers from the fact that the radiation contains an appreciable component of hard x-rays. These hard x-rays are undesirable for uses with biological samples, as well as, for x-ray lithography for the reasons stated above. This latter point is more fully discussed in an article "Diagnostic Techniques in Laser Fusion Research" by P. J. Mallozzi and H. M. Epstein, Research/Development, pp. 30–42 February 1976).

An inexpensive and reproducible source of soft x-rays can be produced by a spark discharge method. This is described in an article entitled "Continuum Radiation Source of High Intensity", printed in the Journal of Optical Society of America, Vol. 58, No. 2, pp. 203–206, 1968. This device will produce the desired range of radiation but the intensity is insufficient to allow either the exposure of biological samples or exposure of photoresist used in lithography with a single flash.

While other high intensity radiation generating sources are available (e.g., U.S. Pat. No. 3,512,030), the spectrum of radiation generated by these devices are more heavily weighted towards the ultraviolet segment of the spectrum and therefore not particularly applicable for uses in either x-ray lithography or biological microscopy.

DISCLOSURE OF INVENTION

It is the object of this invention to provide a soft x-ray source wherein the principal portion of the radiation lies between 10 Å and 400 Å.

Another object of this invention is to provide a high intensity source which acts over a short period of time.

A further object of this invention is to provide a stable concentrated source of radiation (e.g., a point source).

Still a further object of this invention is a device which generates x-rays that are compatible for use in microscopy of biological samples.

The final object of the invention is a device for generating x-rays which are compatible with x-ray lithography.

A method and device for accomplishing the above objectives and for generating flash, high intensity soft x-rays is described. The device has a first plate of a conductive material, an intermediate layer of an insulating material attached to the first conductive plate and a second plate of a conductive material attached to the intermediate layer and electrically isolated from the first conductive plate. A capillary opening which extends through the first conducting plate, the insulating layer and the second conducting plate forms a cylindrical passage. A first electrode is aligned with the passage. The first electrode has a tapered end which is adjacent to and spaced apart from the second plate. The second plate is maintained at a potential with respect to the first plate by a first capacitive storage means. Likewise the first electrode is maintained at a potential with respect to the first plate by a second capacitive storage means. The first electrode is electrically connected to the second plate by a means for electrical connection that under D.C. operating conditions equalizes the potential between the second plate and the first electrode but prevents equalization under pulse operating conditions. A means for triggering a discharge between the first and second plates allows the discharge of the second plate to the first plate. When this discharge occurs and a means to supply ions to the cylindrical passage is provided, an ionized plasma is established in the cylindrical passage. The electrode discharges through the cylindrical passage interacting with the plasma and generating an intense burst of x-rays.

While the invention may be described in terms of the above-mentioned device, alternatively it may be described by the following process. A gas is ionized. The ionized gas is subject to an electric field. The ionized gas is constrained in a capillary passage and is subject to an electric field. A plasma is created which is constrained by the passage. An electron beam is passed through the plasma and interacts with the plasma to generate x-rays.

BEST MODE OF CARRYING OUT THE INVENTION

Figure 1:
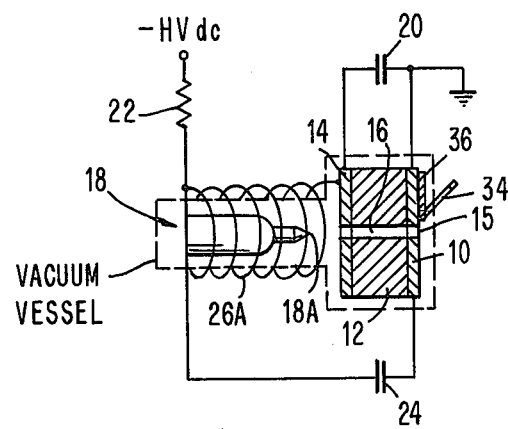
FIG. 1 is a schematic representation of one embodiment of the flash x-ray device wherein the first electrode is electrically connected to the second conducting plate through an inductive coil.

FIG. 1 depicts one embodiment of the present invention, wherein a first conductive plate 10 is attached to an intermediate layer 12 of insulating material which in turn is attached to a second conductive plate 14. A first capillary opening 15 which extends through the first conductive plate 10, the intermediate layer 12 and the second conductive plate 14 forms a cylindrical capillary passage 16. A first electrode 18 having a tapered end 18A is aligned with the cylindrical capillary passage 16 and is spaced apart from the second conductive plate 14. A first capacitor 20 serves as a means for storing energy between the first plate 10 and the second plate 14. It should be appreciated that a first bank of capacitors could be substituted for the capacitor 20. In this case the individual capacitors should be arranged so that the charge is symmetrically disposed about the cylindrical capillary passage 16. The capacitor can be charged by a DC power supply not shown through a resistive element 22 which is appropriately selected to prevent unwarranted discharge of capacitor 20. A second capacitor 24 connected to the electrode 18 and the first plate 10 serves as a means for storing energy between these elements. The comment made with respect to the first capacitor 20 applies with equal force to the second capacitor 24 and a second bank of capacitors could replace the second capacitor 24. An inductive coil 26A serves as a means for electrically connecting the second conductive plate 14 with the first electrode 18.

It is preferred that the inductive coil 26A be matched with the second capacitor 24. This allows ample current flow between the second conducting plate 14 and the first electrode 18 and provides for charging of the second capacitor 24 without creating a significant potential between the second conductive plate 14 and the electrode 18. The inductive coil 26A and the second capacitor 24 will be appropriately matched when the product of the square root of the inductance of the coil 26A and the capacitance of the second capacitor 24 is between about 10 microsecond and 100 microseconds.

Figure 2:
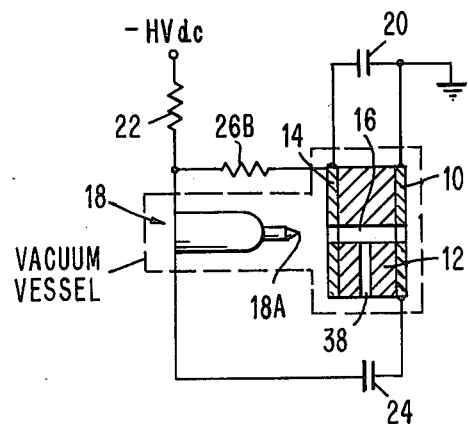
FIG. 2 is a schematic representation of a second embodiment of the flash x-ray device wherein the first electrode is electrically connected to the second conducting plate through a resistive element.

FIG. 2 shows an alternative embodiment where rather than an inductive coil 26A, a resistor 26B is employed to provide the electrical connection between the second plate 14 and the electrode 18.

For the reasons set forth above, the resistor 26B and the second capacitor 24 should be matched. In this case the product of the resistance of the resistor 26B and the capacitance of the second capacitor 24 should be between about 10 microseconds and 1000 microseconds.

The discharge may be triggered by a second electrode 34 as shown in FIG. 1. This electrode 34 is separated from the first plate and may have an insulator 36 between the first plate 10 and the electrode 34.

When discharge occurs in the capillary passage 16, erosion of the insulating material is caused by a spark flash over between plate 14 and plate 10 and allows the insulator to serve as a means for supplying ions to the passage.

Alternatively injecting gas into the cylindrical capillary passage 16 through a second opening 38 illustrated in FIG. 2, will trigger a discharge between the first conductive plate 10 and the second conductive plate 14. Any standard injection system may be employed to supply gas to the second opening 38, one such system being described in an article entitled, "Fast Valve for Gas Injection into Vacuum" by A. Fisher, F. Malzo and J. Shiloh, Rev. of Scientific Inst., Vol. 49, No. 6, June 1978, pp. 872-873. The injected gas will be ionized by the discharge and in addition to serving as the trigger means serves as the ion supply. It is also possible to inject gas into the capillary passage 16 through the opening 15 of first end plate 10.

Preferably energy storage capacities of either the individual capacitors 20 and 24 or the respective banks of capacitors for the present invention should be from approximately 10 joules to about 1 K joule. When the operating voltages are between about 20 kv and about 100 kv, the capacitors should be connected to the plates by symmetrical low inductance paths.

Furthermore preferably the cylindrical capillary passage 16 should be from about 0.1 millimeters to 3 millimeters in diameter and the length of the insulating section of the capillary passage 16 should be from about 0.1 cm to 5 cm. The limited size of the capillary will assure a stable concentrated source of radiation. Conductive plates 10 and 14 should have a thickness from about 0.25 millimeters to 3 millimeters. The tip 18A of the electrode 18 should have a small radius preferably less than a tenth of a millimeter. The preferred material for the electrode 18 and for the conductive plates 10 and 14 is high density carbon such as poco grade. It should also be appreciated that the design of the capillary chamber must be constructed with the principals of high voltage technology, as is further discussed in R. Hawley's article "Solid Insulators in Vacuum: A Review," Vacuum, Vol. 18, No. 7, pp. 383-90.

The above described device is designed to operate in a low pressure environment. Typically, the pressure should be $10^{-5}$ torr or less. Preferably these pressures may be maintained by encapsulating the device save the capacitors in a vacuum chamber as is shown by the dotted lines in FIGS. 1 and 2. The vacuum chamber is continuously pumped to maintain a low pressure by a device such as an oil diffusion pump. Once the chamber has been evacuated the capacitors 20 and 24 may be charged by a DC supply through a resistive element 22. Once the capacitors are fully charged the plates 10 and 14 may be discharged by the second electrode 34 which is employed to generate a spark between the second electrode and the first conductive plate 10. This spark in turn will illuminate the capillary chamber with sufficient ultraviolet radiation to initiate discharge between the conducting plates 10 and 14. The discharge spark travelling down the capillary tubes from 14 and 10 causes erosion of the surface of the insulating material 12 creating a desired plasma. This insulating material should have at least one element with a Z number (atomic number) which is less than eighteen. While it would be possible to ionize heavier elements than Argon ($Z=18$), ionization of the heavier ions would not expose the K-shell electrons and therefore limit x-ray generation. To maximize the radiation it is preferred that all elements in the insulating material have a Z number which is less than eighteen. The discharge of second plate 14 results in a potential between the first electrode 18 and the second plate 14 which in turn draws electrons from the electrode 18 creating an electron beam. The electron beam may be tuned to optimize the radiation pulse output by matching the impedance of the electron beam with the impedance of the capacitor 24, and its connection to the first plate 10 by adjusting the spacing between the second plate 14 and the electrode 18. As the beam travels through the capillary it interacts with the plasma generating soft x-rays.

The plasma can be made self-triggered by reducing the thickness of the insulating material. The thickness of this zone will determine at what voltage a discharge will occur across the insulating material layer 12 which is between the conducting plates 10 and 14. Thereafter all the steps being similar to the preceding described steps.

It is also possible to introduce various gases into the capillary passage 16. These gases in addition to serving to trigger the discharge between the conductive plates 10 and 14 are the ion source for the plasma. The plasma being characteristic of the gas introduced into the capillary passage 16. A variety of x-ray spectrum can be generated by the proper selection of either the gas introduced into the capillary opening or alternatively in the case of the spark discharge process by the proper selection of the insulating material. Further refinement of the spectrum is possible by adjusting the size of the cylindrical capillary passage 16. The size of the passage 16 will effect the temperature of the plasma and thereby the resulting x-ray spectrum.

While I have illustrated and described the preferred embodiments of my invention, it is to be understood that I do not limit myself to the precise constructions herein disclosed and the right is reserved to all changes and modifications coming within the scope of the invention as defined in the appended claims.

Having described the invention, what is claimed as new and what is desired to secure by Letters Patent is:

1. An x-ray device for employment in a vacuum chamber comprising:
    a first plate of a conductive material;
    an intermediate layer of an insulating material attached to said first conductive plate;
    a second plate of a conductive material attached to said intermediate layer and electrically isolated from said first conductive plate;
    a cylindrical capillary passage formed by a first capillary opening which extends through said first conductive plate, said layer of insulating material and said second conducting plate;
    a first electrode having a tapered end, said electrode spaced apart from said second conducting plate and aligned with said cylindrical capillary passage;
    means for supplying ions to said cylindrical capillary passage;
    first means for storing capacitive energy so that said second plate is maintained at a potential with respect to said first plate;
    second means for storing capacitive energy so that said first electrode is maintained at a potential with respect to said first plate;
    means for electrically connecting said first electrode and said second conducting plate allowing passage of a current to equalize the potential between said second conductive plate and said first electrode; and
    means for triggering a discharge between said first conductive plate and said second conductive plate, where an ionized plasma is established in said cylindrical capillary passage and said electrode discharges an electron beam into said plasma causing the generation of x-rays.

2. The x-ray device of claim 1 wherein said first means for storing capacitive energy further comprises a first bank of capacitors symmetrically disposed about said cylindrical capillary passage.

3. The x-ray device of claim 2 wherein said second means for storing capacitive energy further comprises a second bank of capacitors symmetrically disposed about said cylindrical capillary passage.

4. The x-ray device of claim 3 wherein said means for connection between said first electrode and second plate further comprises an inductive coil coaxially and symmetrically disposed about said first electrode.

5. The x-ray device of claim 3 wherein said means for electrically connecting said first electrode and said second conducting plate further comprises a resistor, said resistor being selected such that the product of the resistance of said resistor and the capacitance of said second bank of capacitors is between about 10 microseconds and 1000 microseconds.

6. The x-ray device of claim 3 wherein said means for electrically connecting said first electrode and said second conducting plate further comprises an inductive coil, said inductive coil being selected such that the product of the square root of the inductance of said inductive coil and the capacitance of said second bank of capacitors is between about 10 microseconds and 1000 microseconds.

7. The x-ray device of claim 1 wherein said means for supplying ions to said cylindrical capillary passage further comprises a second capillary opening connected to and radiating away from said cylindrical capillary passage through which gas is passed into said cylindrical capillary passage, said gas serving to trigger a discharge between said first plate and second plate thereby ionizing said gas.

8. The x-ray device of claim 1 wherein said triggering means further comprises a second electrode, and an insulator separating said second electrode from said first plate.

9. The x-ray device of claim 1 wherein said cylindrical capillary passage is between about 0.1 mm and 3 mm in diameter and the length of said passage should be between about 0.1 cm and 5 cm while the thickness of said electrode should be between 0.25 mm and 3 mm.

10. The x-ray device of claim 1 wherein said tapered end of said first electrode has a radius of curvature of less than 1/10 mm and further wherein said electrode is of high density carbon.

11. The x-ray device of claims 4 or 5 wherein said storage capacity of each of said banks of capacitors is about 10 joules to 1000 joules and the potential at which said bank of capacitors is maintained is between about 20 kv and 500 kv.

12. The x-ray device of claim 1 wherein said capacitors are mounted external to the vacuum chamber.

13. The x-ray device of claim 1 wherein said insulating material has at least one element with a Z number of less than eighteen, said material being susceptible to ionization by a spark discharge and serves as means for supplying ions to said capillary passage.

14. The x-ray device of claim 12 wherein said insulating material consists of elements selected from those elements with Z less than or equal to eighteen.

* * * * *